United States Patent
Hwang et al.

(10) Patent No.: US 9,841,470 B2
(45) Date of Patent: Dec. 12, 2017

(54) TRIAXIAL COIL SENSOR AND MAGNETIC FIELD MEASURING DEVICE INCLUDING THE SAME

(71) Applicant: Electronics and Telecommunications Research Institute, Daejeon (KR)

(72) Inventors: Jung Hwan Hwang, Daejeon (KR); Jong Hwa Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 48 days.

(21) Appl. No.: 14/997,217

(22) Filed: Jan. 15, 2016

(65) Prior Publication Data
US 2016/0245878 A1    Aug. 25, 2016

(30) Foreign Application Priority Data
Feb. 23, 2015    (KR) .......... 10-2015-0025290

(51) Int. Cl.
G01R 33/02    (2006.01)
G01R 33/04    (2006.01)
G01R 33/00    (2006.01)

(52) U.S. Cl.
CPC ..... *G01R 33/0206* (2013.01); *G01R 33/0005* (2013.01)

(58) Field of Classification Search
CPC .................. G01R 33/0206; G01R 33/0005
See application file for complete search history.

(56) References Cited

U.S. PATENT DOCUMENTS

| | | | |
|---|---|---|---|
| 5,440,232 A * | 8/1995 | Scarzello | G01R 29/0857 324/247 |
| 7,352,177 B2 | 4/2008 | Lee et al. | |
| 8,067,934 B2 * | 11/2011 | Janke | G01R 33/07 324/207.15 |
| 2010/0089993 A1 | 4/2010 | Shin et al. | |
| 2013/0226516 A1 | 8/2013 | Jeon et al. | |

FOREIGN PATENT DOCUMENTS

| | | |
|---|---|---|
| KR | 100532622 B1 | 6/2005 |
| KR | 100851817 B1 | 8/2008 |
| KR | 1020120010051 A | 2/2012 |

* cited by examiner

*Primary Examiner* — Jermele M Hollington
*Assistant Examiner* — Zannatul Ferdous
(74) *Attorney, Agent, or Firm* — William Park & Associates Ltd.

(57) ABSTRACT

Provided is a magnetic field measuring device including a first sensor unit which includes a first coil sensor configured to output a first sensor signal, a second sensor unit which includes a second coil sensor configured to output a second sensor signal and disposed in a direction perpendicular to the first coil sensor, a third sensor unit which includes a third coil sensor configured to output a third sensor signal and disposed in a direction perpendicular to the first and second coil sensors, and a digital signal processor outputs magnetic flux density based on a voltage difference between the first and fourth nodes, wherein the first to third sensor units respectively output first to third output signals in which specific voltages of the first to third sensor signals are maintained for a predetermined period of time.

16 Claims, 11 Drawing Sheets

FIG. 7

| Magnetic Flux Density(Wb/m$^2$) | Voltage(V) |
|---|---|
| 1 | V1 |
| 2 | V2 |
| 3 | V3 |
| ⋮ | ⋮ |
| n | Vn |

US 9,841,470 B2

TRIAXIAL COIL SENSOR AND MAGNETIC FIELD MEASURING DEVICE INCLUDING THE SAME

CROSS-REFERENCE TO RELATED APPLICATIONS

This U.S. non-provisional patent application claims priority under 35 U.S.C. §119 to Korean Patent Application No. 10-2015-0025290, filed on Feb. 23, 2015, the entire contents of which are hereby incorporated by reference.

BACKGROUND OF THE INVENTION

The present disclosure herein relates to magnetic field measuring devices, and more particularly, to triaxial coil sensors for measuring a cumulative magnetic field in space and magnetic field measuring devices including the same.

Due to a magnet or an electric field changed according to a current or time, a space is produced in the surroundings in which a magnetic force acts. The space is referred to as a magnetic field. The magnetic field affects a moving charge, and the moving charge may generate a magnetic field.

Recently, in line with the provision of various services using radio technology in everyday life, an interest in the effect of electromagnetic waves on a user's health has been grown. Accordingly, a system for measuring the amount of electromagnetic waves, to which people are exposed in everyday life, has been studied. In particular, a measurement system for measuring the magnitude of a magnetic field in a low-frequency band (e.g., about 30 MHz or less) has been used.

SUMMARY OF THE INVENTION

The present disclosure provides a triaxial coil sensor, which improves isolation characteristics of a sensor unit in each axial direction and reduces power consumption, and a magnetic field measuring device including the triaxial coil sensor.

An embodiment of the inventive concept provides a magnetic field measuring device including: a first sensor unit which includes a first coil sensor configured to output a first sensor signal and is connected to a first node and a second node; a second sensor unit which includes a second coil sensor configured to output a second sensor signal and disposed in a direction perpendicular to the first coil sensor, and is connected to the second node and a third node; a third sensor unit which includes a third coil sensor configured to output a third sensor signal and disposed in a direction perpendicular to the first and second coil sensors, and is connected to the third node and a fourth node; and a digital signal processor which is connected to the first and fourth nodes and outputs magnetic flux density based on a voltage difference between the first and fourth nodes, wherein the first to third sensor units respectively output first to third output signals in which specific voltages of the first to third sensor signals are maintained for a predetermined period of time.

In an embodiment of the inventive concept, a magnetic field measuring device includes: a first sensor unit which includes a first coil sensor configured to output a first sensor signal; a second sensor unit which includes a second coil sensor configured to output a second sensor signal and disposed in a direction perpendicular to the first coil sensor; a third sensor unit which includes a third coil sensor configured to output a third sensor signal and disposed in a direction perpendicular to the first and second coil sensors; and a digital signal processor configured to convert magnetic flux density based on first to third output signals from the first to third sensor units, wherein each of the first to third sensor units includes a band-pass filter that is independent from the other sensor units to select the first to third output signals having a desired frequency which are respectively included in the first to third sensor signals.

In an embodiment of the inventive concept, a triaxial coil sensor includes: a first coil sensor which includes a disc-shaped core having a first diameter and a first height and a first coil wound around the disc-shaped core; a second coil sensor which includes a first cylindrical core provided in the disc-shaped core to have a second diameter and a second height and a second coil wound on a cylindrical surface of the first cylindrical core; and a third coil sensor which includes a second cylindrical core provided in the disc-shaped core in a direction perpendicular to the first cylindrical core to have the second diameter and the second height and a third coil wound on a cylindrical surface of the second cylindrical core, wherein central axes of the first and second cylindrical cores are parallel to a disc surface of the disc-shaped core.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 7 exemplarily illustrates a magnetic flux density conversion table used in a magnetic flux density conversion circuit of FIG. 3;

DETAILED DESCRIPTION OF PREFERRED EMBODIMENTS

Figure 1:
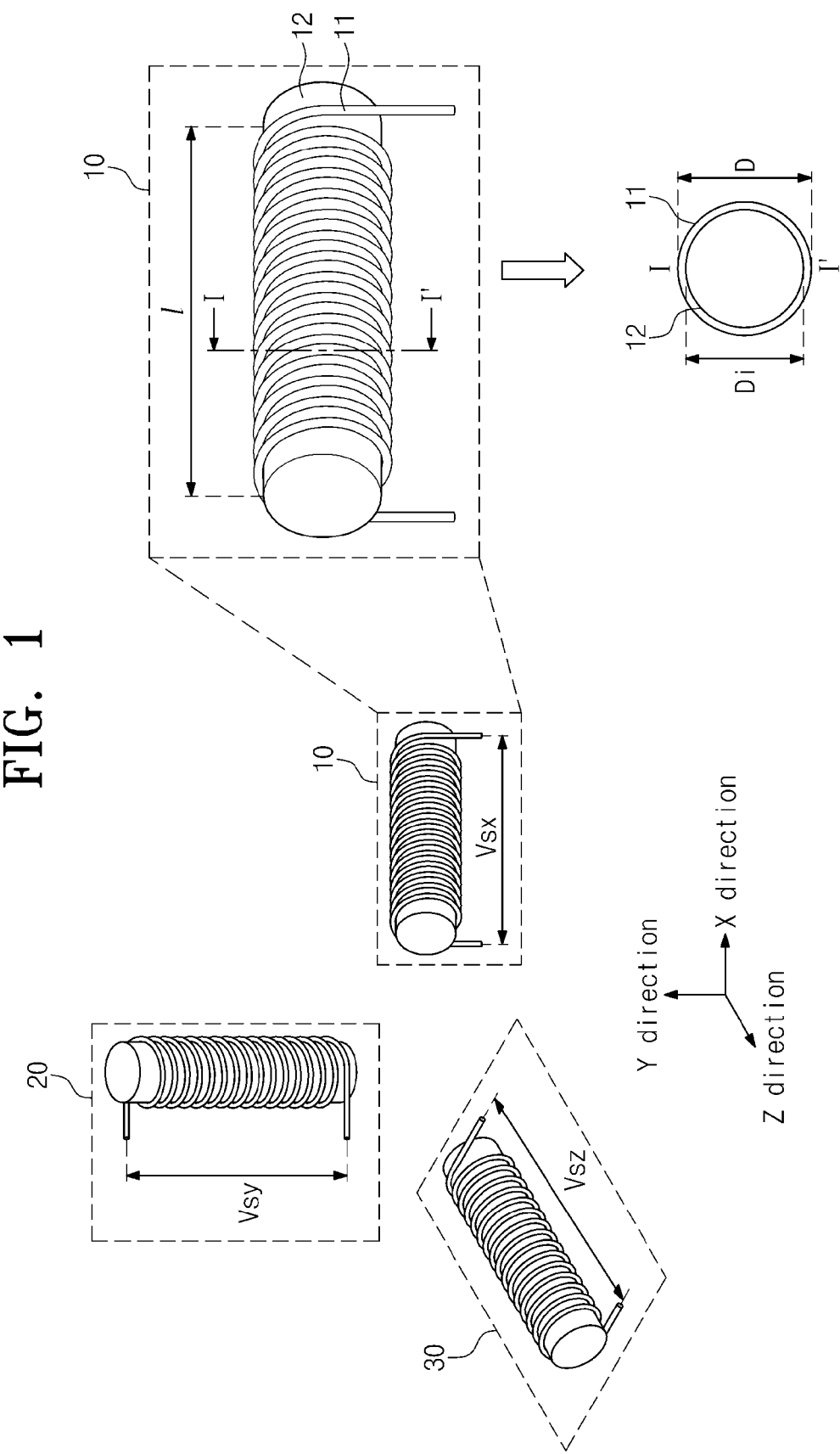
FIG. 1 exemplarily illustrates a magnetic field sensor for measuring the magnitude of a magnetic field.

It should be construed that foregoing general illustrations and following detailed descriptions are exemplified and an additional explanation of claimed inventions is provided. Reference numerals are indicated in detail in preferred embodiments of the inventive concept, and their examples are represented in reference drawings. In every possible case, like reference numerals are used for referring to the same or similar elements in the description and drawings.

Hereinafter, a magnetic field measuring device will be used as one example of an electrical device for illustrating characteristics and functions of the inventive concept. However, those skilled in the art can easily understand other advantages and performances of the inventive concept according to the descriptions. Also, the inventive concept may be embodied or applied through other embodiments. Besides, the detailed description may be amended or modified according to viewpoints and applications, not being out of the scope, technical idea and other objects of the inventive concept.

FIG. 1 exemplarily illustrates a magnetic field sensor for measuring the magnitude of a magnetic field. Referring to FIG. 1, the magnetic field sensor may include three coil sensors 10, 20, and 30 which are perpendicular to one another. Cores respectively included in the coil sensors 10, 20, and 30 may be respectively disposed in X-axis, Y-axis, and Z-axis directions. The X-axis direction and Y-axis direction are perpendicular to each other and the Z-axis direction is a direction perpendicular to a plane formed by the X-axis and the Y-axis.

A magnetic field formed in space has a random direction. Thus, the magnetic field formed in space may be calculated by measuring a magnetic flux density in each of the mutually perpendicular X-axis, Y-axis, and Z-axis directions and then summing the magnetic flux densities in the three directions. When the magnetic flux densities corresponding to each direction (X-axis, Y-axis, and Z-axis) are denoted as $B_x$, $B_y$, and $B_z$, a total magnetic flux density (B total) may be represented by Equation 1.

$$B_{total} = |B_x| + |B_y| + |B_z| \qquad \text{[Equation 1]}$$

In FIG. 1, the coil sensors 10, 20, and 30 exemplarily illustrate magnetic field sensors corresponding to each direction (X-axis, Y-axis, and Z-axis). Each of the coil sensors 10, 20, and 30 exemplarily illustrates an induction-type magnetic field sensor. Hereinafter, the coil sensor 10 will be described as an example. The coil sensors 20 and 30 may have the same structure and properties as the coil sensor 10. In the induction-type coil sensor 10, a coil 11 is a form of a conducting wire having high electrical conductivity, such as copper, to measure the magnitude of the magnetic field. A voltage $V_{sx}$ is generated between both ends of the conducting wire of the coil 11 by the changing magnetic field according to Faraday's law. The coil sensor 10 may measure the magnetic field by using the voltage $V_{sx}$ generated between the both ends of the conducting wire of the coil 11.

$$V_{sx} = 0.5\pi^2 f n D^2 B_{core} \qquad \text{[Equation 2]}$$

The coil 11 having a circular cross section as well as a diameter D outputs the voltage $V_{sx}$ as in Equation 2 by the magnetic field formed in the coil. Herein, f is a frequency of the magnetic field, n is the number of windings of the coil, and $B_{core}$ represents magnetic flux density of the magnetic field formed in the coil.

When the magnetic flux density ($B_{core}$) is increased, sensing sensitivity of the coil sensor 10 may be improved. For this purpose, a magnetic material, such as ferrite, may be used in a core 12. When the core 12 having a diameter $D_i$ and a length l is disposed in the coil 11, the magnetic flux density ($B_{core}$) is proportional to permeability of the core 12. However, the magnetic flux density ($B_{core}$) is saturated by a physical size (i.e., $D_i$ and l) of the core 12. Thus, the voltage $V_{sx}$ outputted from both ends of the coil 11 may be represented by Equation 3.

$$V_{sx} \cong 0.9 \times 10^{-5} f \frac{l^3}{d^2} D_i \frac{1}{\ln\left(\frac{2l}{D_i}\right) - 1} H_{core} \qquad \text{[Equation 3]}$$

Where $H_{core}$ represents magnetic field strength formed in the coil and d represents a diameter of the conducting wire used in the coil. Since the magnetic field strength ($H_{core}$) is independent of a magnetic material, the magnetic field strength ($H_{core}$) is the same as magnetic field strength of a magnetic field formed in a free space. Thus, the coil sensor 10 including the core 12 may measure the magnetic field strength ($H_{core}$) of a magnetic field which is formed in a longitudinal direction (i.e., X-axis direction) of the core 12. Thus, each of the coil sensors 10, 20, and 30 may measure a magnetic field in each direction (X-axis, Y-axis, and Z-axis). Eventually, the magnetic field in space may be obtained by summing the magnetic fields in each of the mutually perpendicular directions (X-axis, Y-axis, and Z-axis).

Figure 2:
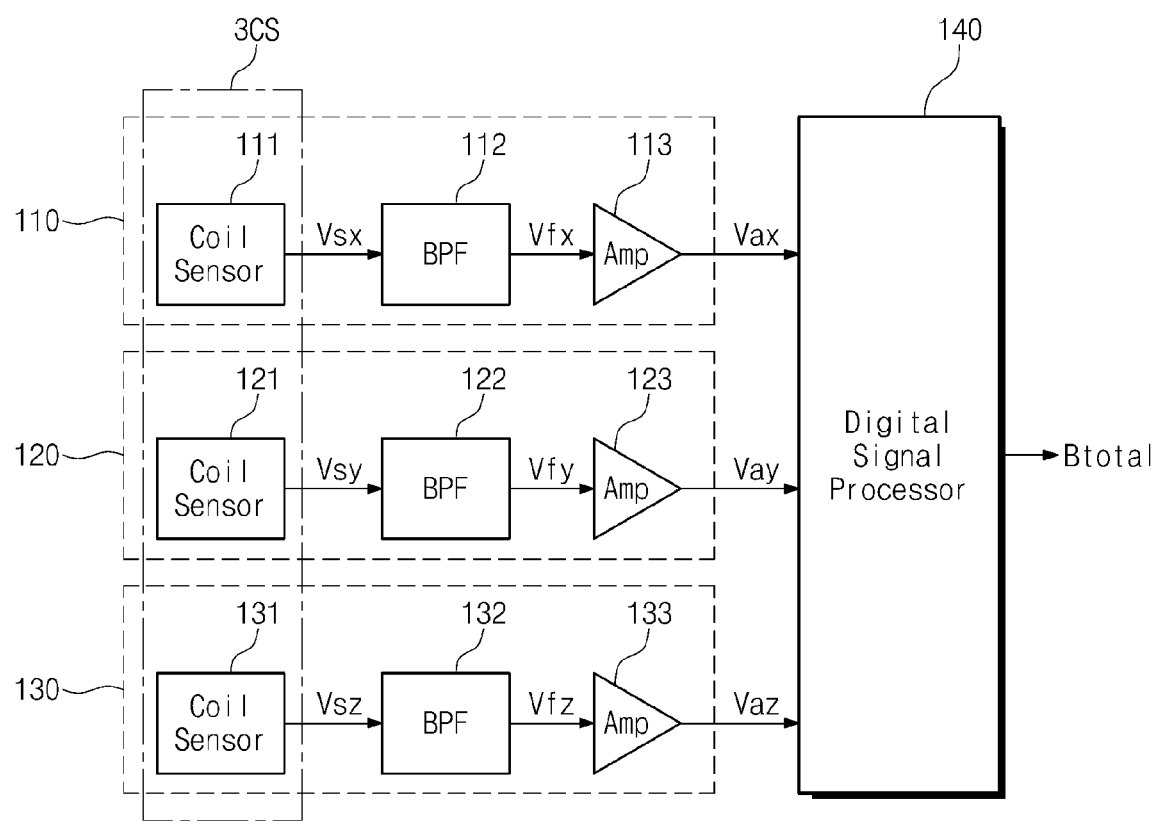
FIG. 2 is a block diagram illustrating a magnetic field measuring device according to an embodiment of the inventive concept.

FIG. 2 is a block diagram illustrating a magnetic field measuring device according to an embodiment of the inventive concept. Referring to FIG. 2, a magnetic field measuring device 100 may include first to third sensor units 110, 120, and 130 and a digital signal processor 140. Each sensor unit may include independent coil sensor, band-pass filter, and amplifier. Each sensor unit may measure a magnetic field in each direction (X-axis, Y-axis, and Z-axis).

The first sensor unit 110 may include a coil sensor 111, a band-pass filter 112, and an amplifier 113. The first sensor unit 110 may measure the magnetic field in the X-axis direction. For example, the coil sensor 111 may output a sensor signal $V_{sx}$ according to the magnetic field in the X-axis direction. The coil sensor 111, as illustrated in FIG. 1, may include a core formed of a magnetic material and a coil in which the core is wound with a conducting wire.

The band-pass filter 112 may remove a noise component by receiving the sensor signal $V_{sx}$. The band-pass filter 112, for example, may be realized by using passive components such as a resistor, an inductor, and a capacitor. Also, the band-pass filter 112 may be realized by using active components such as an operational (OP) amplifier. The band-pass filter 112 may output a filter signal $V_{fx}$ from which the noise component is removed. The band-pass filter 112 may be set to output the filter signal $V_{fx}$ corresponding to a desired magnetic field frequency from the sensor signal $V_{sx}$.

In order to increase sensing sensitivity of the first sensor unit 110, there is a need to amplify the filter signal $V_{fx}$. The amplifier 113 may receive and amplify the filter signal $V_{fx}$. The amplifier 113 may output an amplified signal $V_{ax}$. The amplified signal $V_{ax}$ is proportional to the magnetic flux density of the magnetic field to be detected by the coil sensor 111. Thus, the magnetic field measuring device 100 may obtain the magnetic flux density $B_x$ in the X-axis direction based on the amplified signal $V_{ax}$.

The second and third sensor units 120 and 130 may be configured in the same manner as the first sensor unit 110. The second sensor unit 120 may include a coil sensor 121, a band-pass filter 122, and an amplifier 123. The third sensor unit 130 may include a coil sensor 131, a band-pass filter 132, and an amplifier 133. The second sensor unit 120 may measure the magnetic field in the Y-axis direction. The third sensor unit 130 may measure the magnetic field in the Z-axis direction. For example, the second sensor unit 120 may output an amplified signal $V_{ay}$. The third sensor unit 130 may output an amplified signal $V_{az}$. Since generation processes of the amplified signals $V_{ay}$ and $V_{az}$ are the same as a generation process of the amplified signal $V_{ax}$, the generation processes of the amplified signals $V_{ay}$ and $V_{az}$ will not be provided.

The digital signal processor 140 may receive the amplified signals $V_{ax}$, $V_{ay}$, and $V_{az}$. The digital signal processor 140 may convert the amplified signals $V_{ax}$, $V_{ay}$, and $V_{az}$ into digital codes. The digital signal processor 140 may convert the converted digital codes into the magnetic flux densities corresponding to each direction (X-axis, Y-axis, and Z-axis).

The digital signal processor 140 may output a total magnetic flux density $B_{total}$ by summing the magnetic flux densities $B_x$, $B_y$, and $B_z$ corresponding to each direction (X-axis, Y-axis, and Z-axis). However, a method of obtaining the total magnetic flux density $B_{total}$ is not limited thereto. For example, the converted digital codes may be first summed and the digital signal processor 140 may then convert it into the total magnetic flux density $B_{total}$.

The digital signal processor 140 may convert the digital codes into the magnetic flux densities by various methods. For example, the digital signal processor 140 may convert the digital codes into the magnetic flux densities using Equation 3. Also, the digital signal processor 140 may store a magnetic flux density conversion table. The magnetic field measuring device 100 may store a digital code measured in a specific magnetic field. Thus, the digital signal processor 140 may calculate current magnetic flux density using the magnetic flux density conversion table stored in advance. However, a method of calculating the magnetic flux density is not limited thereto.

The magnetic field measuring device 100 according to the inventive concept may use the independent amplifiers 113, 123, and 133 in the first to third sensor units 110, 120, and 130. Thus, the magnetic field measuring device 100 may obtain improved isolation characteristics between each sensor unit. Also, since a multiplexer or switch for selecting output signals of the coil sensors 111, 121, and 131 is not used, the magnetic field measuring device 100 may reduce power consumption.

Figure 3:
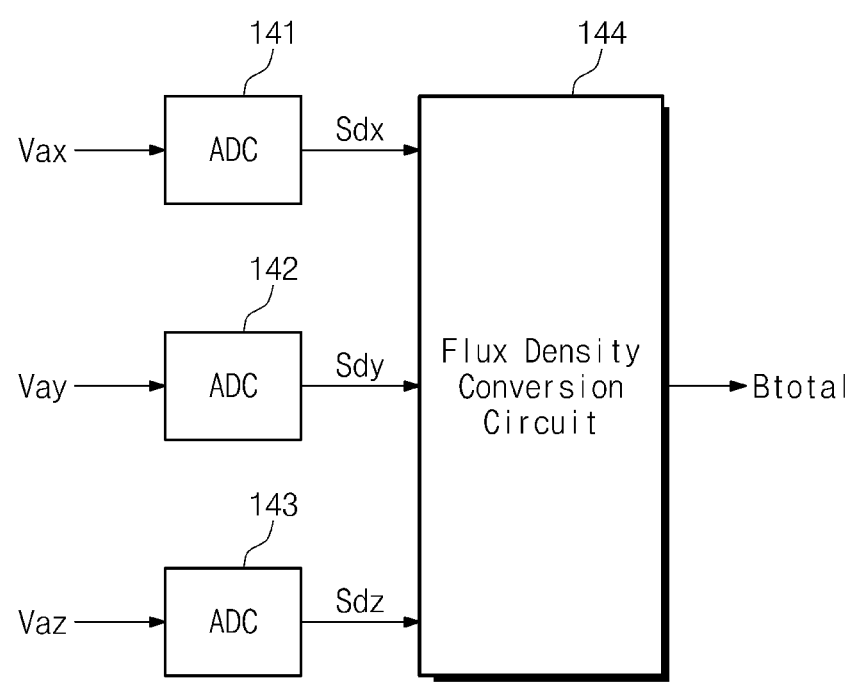
FIG. 3 is a block diagram exemplarily illustrating a digital signal processor of FIG. 2.

FIG. 3 is a block diagram exemplarily illustrating the digital signal processor of FIG. 2. Referring to FIG. 3, the digital signal processor 140 may include analog-digital converters 141, 142, and 143 and a magnetic flux density conversion circuit 144. The digital signal processor 140 may receive the amplified signals $V_{ax}$, $V_{ay}$, and $V_{az}$ corresponding to each direction (X-axis, Y-axis, and Z-axis). The digital signal processor 140 may output the total magnetic flux density $B_{total}$ based on the amplified signals $V_{ax}$, $V_{ay}$, and $V_{az}$.

For example, the analog-digital converter 141 may receive the amplified signal $V_{ax}$. The analog-digital converter 141 may convert the amplified signal $V_{ax}$ into a voltage code $S_{dx}$. Also, the analog-digital converter 142 may receive the amplified signal $V_{ay}$. The analog-digital converter 142 may convert the amplified signal $V_{ay}$ into a voltage code $S_{dy}$. Furthermore, the analog-digital converter 143 may receive the amplified signal $V_{az}$. The analog-digital converter 143 may convert the amplified signal $V_{az}$ into a voltage code $S_{dz}$.

The magnetic flux density conversion circuit 144 may output the total magnetic flux density $B_{total}$ by receiving the voltage codes $S_{dx}$, $S_{dy}$, and $S_{dz}$. For example, the magnetic flux density conversion circuit 144 may respectively convert the voltage codes $S_{dx}$, $S_{dy}$, and $S_{dz}$ into the magnetic flux densities $B_x$, $B_y$, and $B_z$ corresponding to each direction (X-axis, Y-axis, and Z-axis). The magnetic flux density conversion circuit 144 may calculate the total magnetic flux density $B_{total}$ by summing the converted magnetic flux densities $B_x$, $B_y$, and $B_z$.

Also, the magnetic flux density conversion circuit 144 may calculate a total voltage code $S_{total}$ by summing the voltage codes $S_{dx}$, $S_{dy}$, and $S_{dz}$. The magnetic flux density conversion circuit 144 may calculate the total magnetic flux density $B_{total}$ by converting the total voltage code $S_{total}$. The magnetic flux density conversion circuit 144 may output the total magnetic flux density $B_{total}$.

The magnetic flux density conversion circuit 144 may convert the voltage codes $S_{dx}$, $S_{dy}$, and $S_{dz}$ into the magnetic flux densities by various methods. For example, the magnetic flux density conversion circuit 144 may convert the voltage codes $S_{dx}$, $S_{dy}$, and $S_{dz}$ into the magnetic flux densities using Equation 3. Also, the magnetic flux density conversion circuit 144 may store a magnetic flux density conversion table. The magnetic field measuring device 100 may store the voltage codes $S_{dx}$, $S_{dy}$, and $S_{dz}$ measured in a specific magnetic field or the total voltage code $S_{total}$. Thus, the magnetic flux density conversion circuit 144 may calculate current magnetic flux density using the magnetic flux density conversion table stored in advance.

Figure 4:
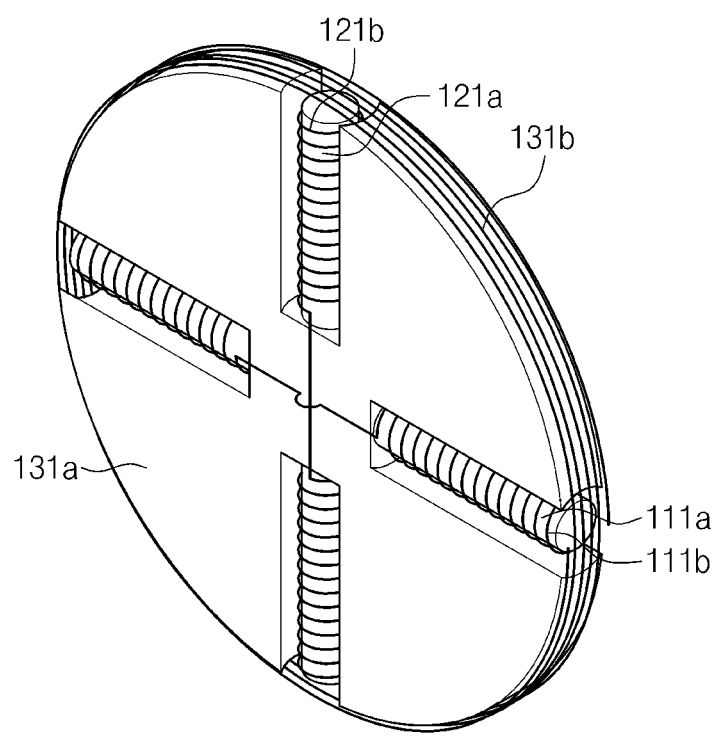
FIG. 4 is a perspective view exemplarily illustrating first to third coil sensors of FIG. 2.
Figure 4:
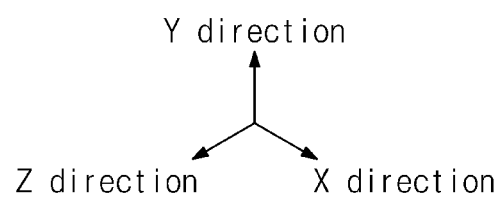
Figure 5:
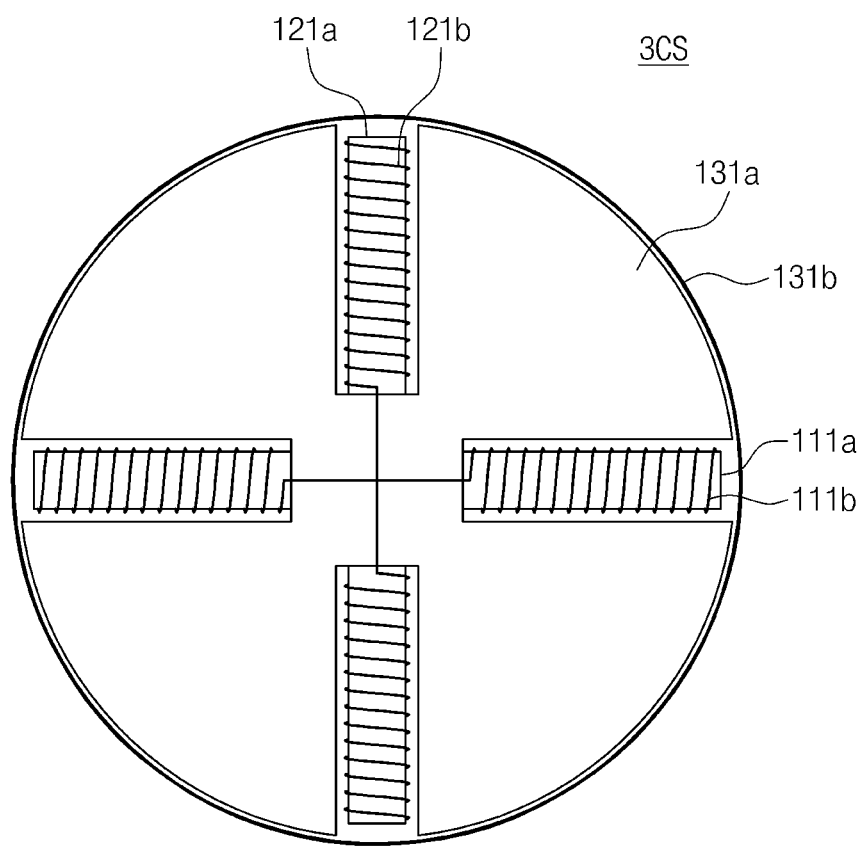
FIG. 5 is a front view exemplarily illustrating the first to third coil sensors of FIG. 4.
Figure 6:
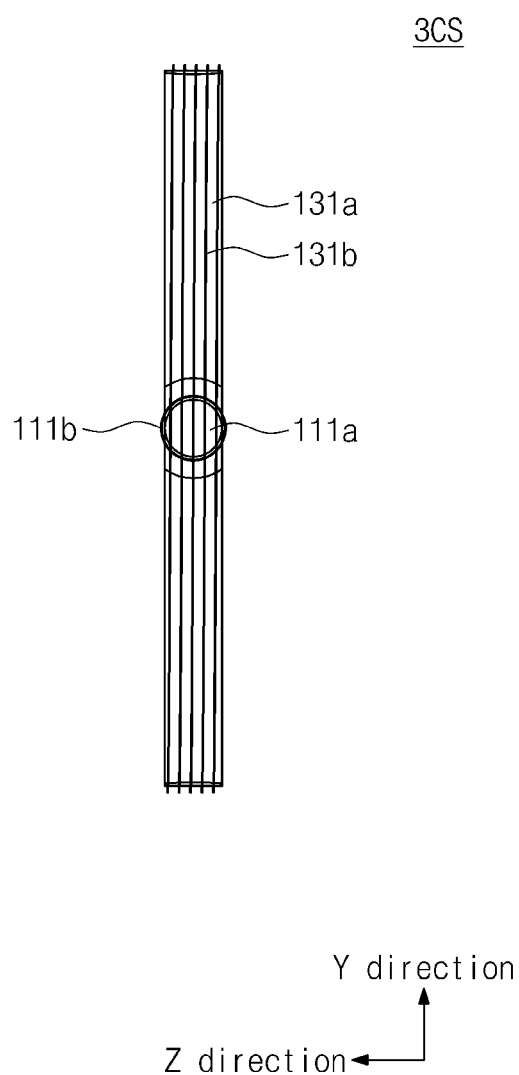
FIG. 6 is a right side view exemplarily illustrating the first to third coil sensors of FIG. 4.

FIG. 4 is a perspective view exemplarily illustrating the first to third coil sensors of FIG. 2. FIG. 5 is a front view exemplarily illustrating the first to third coil sensors of FIG. 4. FIG. 6 is a right side view exemplarily illustrating the first to third coil sensors of FIG. 4. Referring to FIGS. 4 to 6, a thickness of the magnetic field measuring device 100 may be reduced.

As illustrated in FIG. 1, a triaxial coil sensor generally requires cores corresponding to each direction (X-axis, Y-axis, and Z-axis). The cores are generally realized in the form of cylinders having the same diameter and length. Thus, the magnetic field measuring device 100 may have the thickness as much as at least the length of the core.

A triaxial coil sensor 3CS according to the inventive concept may reduce the length of the core in the Z-axis direction. For example, the triaxial coil sensor 3CS may include a disc-shaped core 131a for measuring a magnetic field in the Z-axis direction. Column-shaped cores 111a and 121a for measuring a magnetic field in the X-axis or Y-axis direction may be included in the disc-shaped core 131a. The column-shaped cores 111a and 121a may have a length equal to or less than a diameter of the disc-shaped core 131a. The column-shaped cores 111a and 121a may have a diameter equal to or less than a thickness of the disc-shaped core 131a. Thus, the triaxial coil sensor 3CS according to the inventive concept may have various thicknesses. Coils wound on the column-shaped cores 111a and 121a and the disc-shaped core 131a may be the same.

Although shapes of the column-shaped cores 111a and 121a and the disc-shaped core 131a are different, the column-shaped cores 111a and 121a and the disc-shaped core 131a may be used together to measure a magnetic field. For example, the diameters and lengths (or thicknesses) of the column-shaped cores 111a and 121a and the disc-shaped core 131a may be adjusted to output the same voltage in the same magnetic field using Equation 3. Also, the magnetic field measuring device 100 may use different magnetic flux density conversion tables to convert current voltages measured by the column-shaped cores 111a and 121a and the disc-shaped core 131a into magnetic flux densities.

As described above, the triaxial coil sensor 3CS according to the inventive concept may reduce the length of the core in the Z-axis direction by using the disc-shaped core. Thus, the magnetic field measuring device 100 may reduce its thickness by using the triaxial coil sensor 3CS.

FIG. 7 exemplarily illustrates a magnetic flux density conversion table used in the magnetic flux density conversion circuit of FIG. 3. Referring to FIGS. 3 and 7, the magnetic flux density conversion circuit 144 may convert voltage codes into magnetic flux densities using the magnetic flux density conversion table.

First, the magnetic field measuring device 100 may store a voltage code measured in a specific magnetic field. For example, when the magnetic flux density is 1, the measured total voltage code $S_{total}$ may be V1. When the magnetic flux density is 2, the measured total voltage code $S_{total}$ may be V2. The magnetic field measuring device 100 may generate and store a magnetic flux density conversion table in the above manner. The magnetic flux density conversion table may be generated with respect to the total voltage code $S_{total}$ measured in a specific magnetic field. Also, the magnetic flux density conversion table may be generated with respect to the voltage codes $S_{dx}$, $S_{dy}$, and $S_{dz}$ corresponding to each direction (X-axis, Y-axis, and Z-axis) measured in a specific magnetic field.

When measuring a magnetic field, the magnetic flux density conversion circuit 144 may convert the voltage codes $S_{dx}$, $S_{dy}$, and $S_{dz}$ or the total voltage code $S_{total}$ into magnetic flux densities using the stored magnetic flux density conversion table. For example, when the measured total voltage code $S_{total}$ is V1, the magnetic flux density conversion circuit 144 may output the total magnetic flux density $B_{total}$ having a value of 1. With respect to the total voltage code $S_{total}$ and the voltage codes $S_{ax}$, $S_{dy}$, and $S_{dz}$ which are not included in the magnetic flux density conversion table, the total voltage code $S_{total}$ and the voltage codes $S_{ax}$, $S_{dy}$, and $S_{dz}$ may be converted into magnetic flux densities corresponding thereto by an interpolation method.

Figure 8:
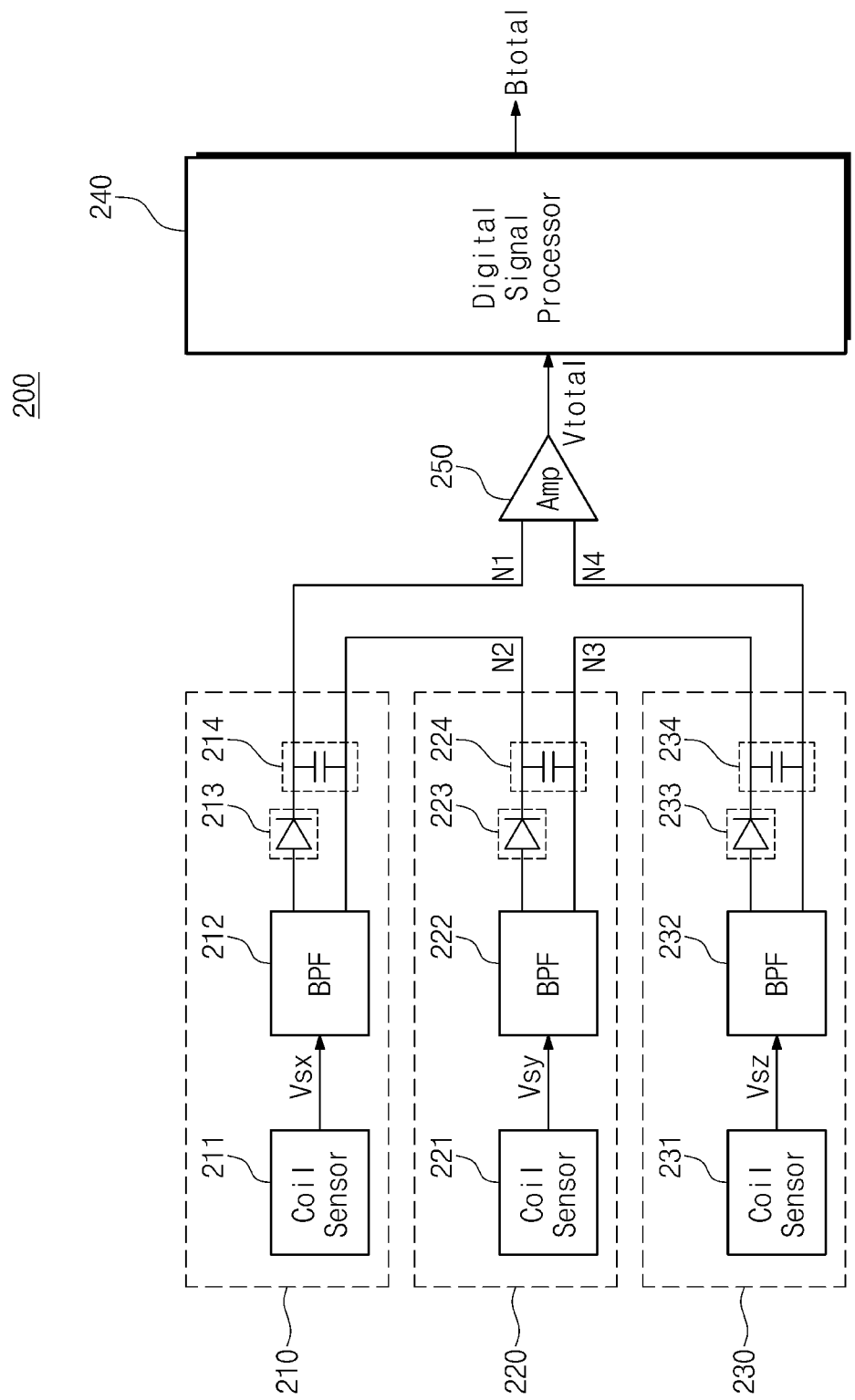
FIG. 8 is a block diagram illustrating a magnetic field measuring device according to another embodiment of the inventive concept.

FIG. 8 is a block diagram illustrating a magnetic field measuring device according to another embodiment of the inventive concept. A magnetic field measuring device 200 may include first to third sensor units 210, 220, and 230, a digital signal processor 240, and an amplifier 250. Each sensor unit may include a coil sensor, a band-pass filter, a unidirectional element, and an electrical storage element. Each sensor unit may measure a magnetic field in each direction (X-axis, Y-axis, and Z-axis).

The first sensor unit 210 may include a coil sensor 211, a band-pass filter 212, a unidirectional element 213, and an electrical storage element 214. The first sensor unit 210 may measure the magnetic field in the X-axis direction. For example, the coil sensor 211 may output a sensor signal $V_{sx}$ according to the magnetic field in the X-axis direction. The band-pass filter 212 may remove a noise component by receiving the sensor signal $V_{sx}$. The band-pass filter 212, for example, may be realized by using passive components such as a resistor, an inductor, and a capacitor. Also, the band-pass filter 212 may be realized by using active components such as an OP amplifier. The band-pass filter 212 may output a filter signal from which the noise component is removed. The band-pass filter 212 may be set to output the filter signal corresponding to a desired magnetic field frequency from the sensor signal $V_{sx}$. For example, the filter signal may be a sinusoidal signal.

The unidirectional element 213 may remove a negative component from the filter signal. For example, the unidirectional element 213 may be realized as a diode. The unidirectional element 213 may convert the filter signal into a half-wave rectified signal. The electrical storage element 214 may convert the half-wave rectified signal into a peak signal. For example, the electrical storage element 214 may be realized as a capacitor. The electrical storage element 214 may maintain a voltage signal having a peak value of the half-wave rectified signal for a predetermined period of time to output the voltage signal.

The second and third sensor units 220 and 230 may be configured in the same manner as the first sensor unit 210. The second sensor unit 220 may include a coil sensor 221, a band-pass filter 222, a unidirectional element 223, and an electrical storage element 224. The third sensor unit 230 may include a coil sensor 231, a band-pass filter 232, a unidirectional element 233, and an electrical storage element 234. The second sensor unit 220 may measure the magnetic field in the Y-axis direction. The third sensor unit 230 may measure the magnetic field in the Z-axis direction. For example, the electrical storage element 224 of the second sensor unit 220 may output a peak signal corresponding to a sensor signal $V_{sy}$. The electrical storage element 234 of the third sensor unit 230 may output a peak signal corresponding to a sensor signal $V_{sz}$. Since a generation process of the peak signal of each sensor unit is the same, the generation process of the peak signal will not be provided.

In this case, the electrical storage elements 214, 224, and 234 of the first to third sensor units 210, 220, and 230 and the amplifier 250 may be connected in series. For example, a first input terminal of the amplifier 250 and one end of the electrical storage element 214 may be connected to a node N1. The other end of the electrical storage element 214 and one end of the electrical storage element 224 may be connected to a node N2. The other end of the electrical storage element 224 and one end of the electrical storage element 234 may be connected to a node N3. The other end of the electrical storage element 234 and a second input terminal of the amplifier 250 may be connected to a node N4. Accordingly, a total peak signal summing the peak signals of the electrical storage elements 214, 224, and 234 of the first to third sensor units 210, 220, and 230 may be input to the amplifier 250. Thus, the amplifier 250 may output a total voltage signal $V_{total}$ by amplifying the total peak signal.

The digital signal processor 240 may receive the total voltage signal $V_{total}$. The digital signal processor 240 may convert the total voltage signal $V_{total}$ into a digital code. The digital signal processor 240 may convert the converted digital code into a total magnetic flux density $B_{total}$. For example, the digital signal processor 240 may convert the digital code into the total magnetic flux density $B_{total}$ using a magnetic flux density conversion table stored in advance.

The magnetic field measuring device 200 according to the inventive concept does not use a multiplexer or switch for selecting output signals of the coil sensors 211, 221, and 231. Thus, the magnetic field measuring device 200 may reduce power consumption.

Figure 9:
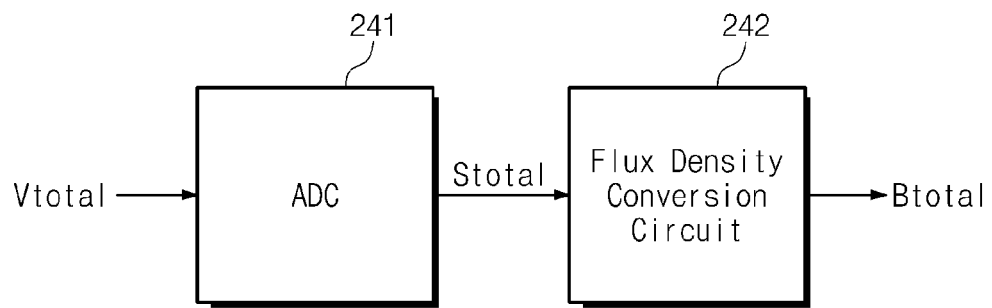
FIG. 9 is a block diagram exemplarily illustrating a digital signal processor of FIG. 8.

FIG. 9 is a block diagram exemplarily illustrating the digital signal processor of FIG. 8. Referring to FIG. 9, the digital signal processor 240 may include an analog-digital converter 241 and a magnetic flux density conversion circuit 242. The digital signal processor 240 may receive the total voltage signal $V_{total}$. The digital signal processor 240 may output the total magnetic flux density $B_{total}$ based on the total voltage signal $V_{total}$.

For example, the analog-digital converter 241 may receive the total voltage signal $V_{total}$. The analog-digital converter 241 may convert the total voltage signal $V_{total}$ into a total voltage code $S_{total}$. The magnetic flux density conversion circuit 242 may output the total magnetic flux density $B_{total}$ by receiving the total voltage code $S_{total}$. For example, the magnetic flux density conversion circuit 242 may include a magnetic flux density conversion table. A voltage corresponding to a specific magnetic flux density may be measured and stored in the magnetic flux density conversion table in advance. The magnetic flux density conversion circuit 242 may convert the total voltage code $S_{total}$ into the total magnetic flux density $B_{total}$ with reference to the magnetic flux density conversion table.

Figure 10:
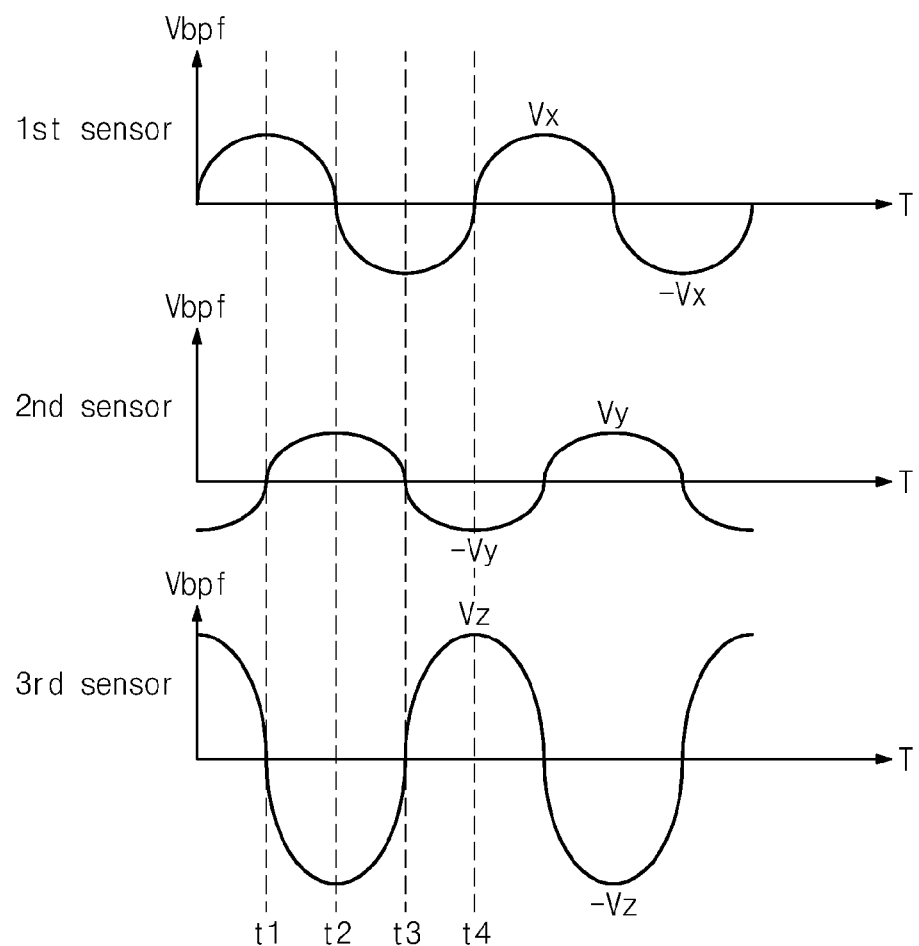
FIG. 10 is a timing diagram illustrating a voltage outputted from a band-pass filter of each sensor unit of FIG. 8.
Figure 11:
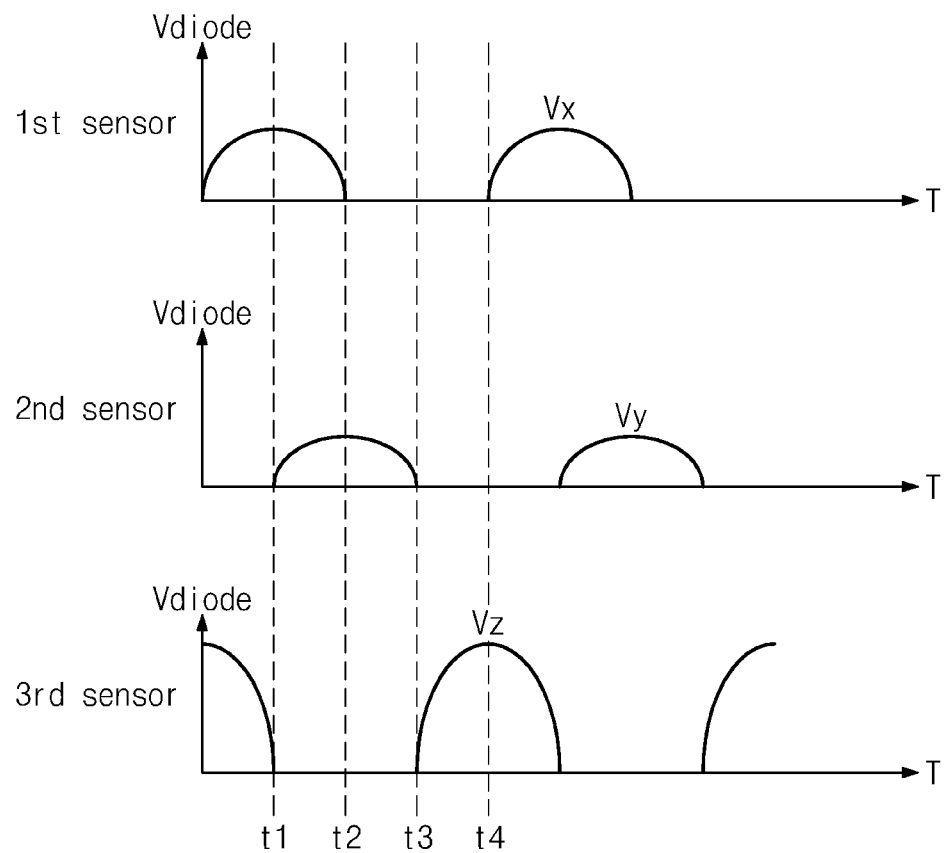
FIG. 11 is a timing diagram illustrating a voltage outputted from a unidirectional element of the each sensor unit of FIG. 8.
Figure 12:
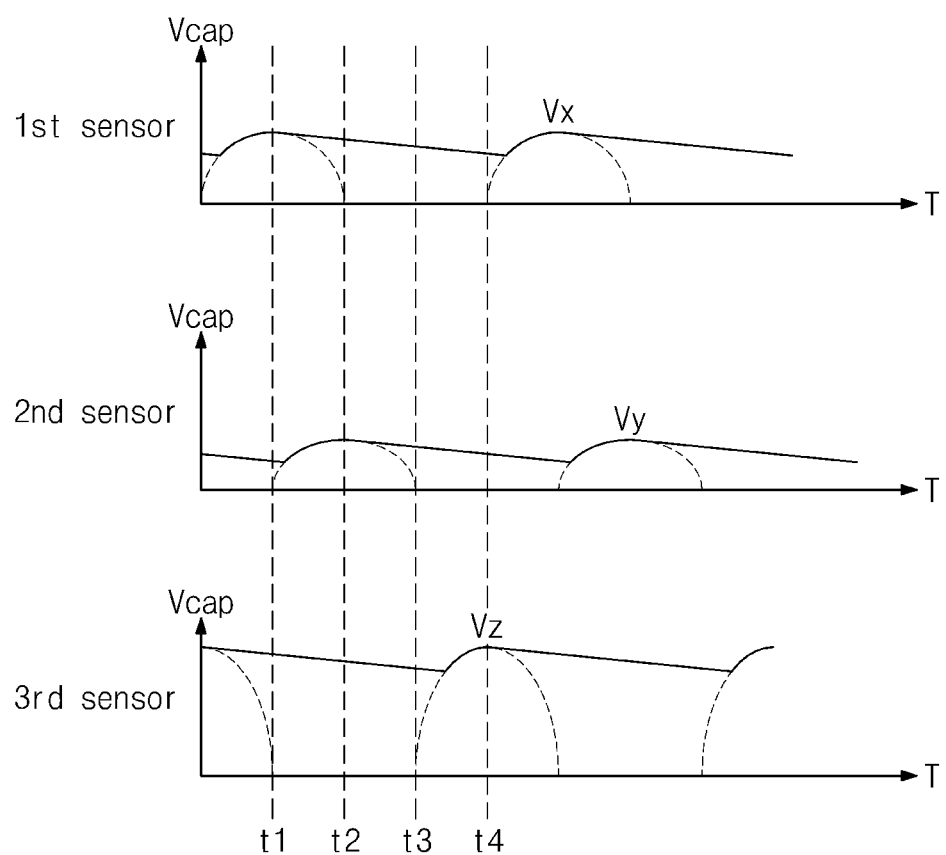
FIG. 12 is a timing diagram illustrating a voltage outputted from an electrical storage element of the each sensor unit of FIG. 8.

FIG. 10 is a timing diagram illustrating a voltage outputted from the band-pass filter of the each sensor unit of FIG. 8. FIG. 11 is a timing diagram illustrating a voltage outputted from the unidirectional element of the each sensor unit of FIG. 8. FIG. 12 is a timing diagram illustrating a voltage outputted from the electrical storage element of the each sensor unit of FIG. 8. Referring to FIGS. 8 to 12, the coil sensors 211, 221, and 231 of the each sensor units 210, 220, and 230 may output the sensor signals $V_{sx}$, $V_{sy}$, and $V_{sz}$ correspond to the magnetic field in each direction (X-axis, Y-axis, and Z-axis).

In FIG. 10, each of the band-pass filters 212, 222, 232 of the sensor units 210, 220, and 230 may output a filter signal $V_{bpf}$ in which noise is removed from the sensor signals $V_{sx}$, $V_{sy}$, and $V_{sz}$. For example, the band-pass filter 212 of the first sensor unit 210 may output the filter signal $V_{bpf}$ having a peak value of $V_x$. The band-pass filter 222 of the second sensor unit 220 may output the filter signal $V_{bpf}$ having a peak value of $V_y$. The band-pass filter 232 of the third sensor unit 230 may output the filter signal $V_{bpf}$ having a peak value of $V_z$.

The filter signal $V_{bpf}$ of the each sensor units 210, 220, and 230 may be a sinusoidal signal. The filter signals $V_{bpf}$ of the each sensor units 210, 220, and 230 may have different phases and peak values from one another. For example, the filter signal $V_{bpf}$ of the first sensor unit 210 may have the peak value $V_x$ at a first time t1. The filter signal $V_{bpf}$ of the second sensor unit 220 may have the peak value $V_y$ at a second time t2. The filter signal $V_{bpf}$ of the third sensor unit 230 may have the peak value $V_z$ at a fourth time t4.

In FIG. 11, each of the unidirectional elements 213, 223, and 233 of the sensor units 210, 220, and 230 may output a half-wave rectified signal $V_{diode}$ by removing a negative portion from the filter signal $V_{bpf}$. The half-wave rectified signal $V_{diode}$ of the each sensor units 210, 220, and 230 may have the same phase and peak value $V_x$, $V_y$, or $V_z$ as the filter signal $V_{bpf}$.

In FIG. 12, each of the electrical storage elements 214, 224, and 234 of the sensor units 210, 220, and 230 may output a peak signal $V_{cap}$ decreasing at a predetermined slope from the peak values $V_x$, $V_y$, and $V_z$ of the half-wave rectified signal $V_{diode}$. Electric storage capacities of the electrical storage elements 214, 224, and 234 may be controlled so that the peak signals $V_{cap}$ may respectively maintain the peak values $V_x$, $V_y$, and $V_z$ for a predetermined period of time. That is, the peak signals $V_{cap}$ may respectively maintain the peak values $V_x$, $V_y$, and $V_z$ for a predetermined period of time by adjusting time constants of the electrical storage elements 214, 224, and 234.

The magnetic field measuring device 200 according to the inventive concept may sum the peak signals $V_{cap}$ of the sensor units 210, 220, and 230 by connecting the amplifier 250 and the sensor units 210, 220, and 230 in series. Thus, the magnetic field measuring device 200 does not use a multiplexer or switch for selecting output signals of the coil sensors 211, 221, and 231. As a result, the magnetic field measuring device 200 may reduce power consumption.

According to an embodiment of the inventive concept, provided is a magnetic field measuring device including a triaxial sensor which may improve isolation characteristics of a sensor unit in each axial direction and may reduce power consumption because a multiplexer or switch for selecting output signals of coil sensors is not used.

Hitherto, the best mode was disclosed in the drawings and specification. While specific terms were used, they were not used to limit the meaning or the scope of the inventive concept described in claims, but merely used to explain the inventive concept. Accordingly, a person having ordinary skill in the art will understand from the above that various modifications and other equivalent embodiments are also possible. Hence, the real protective scope of the inventive concept shall be determined by the technical scope of the accompanying claims.

What is claimed is:

1. A magnetic field measuring device comprising:
a first sensor unit which includes a first coil sensor configured to output a first sensor signal and is connected to a first node and a second node;
a second sensor unit which includes a second coil sensor configured to output a second sensor signal and disposed in a direction perpendicular to the first coil sensor, and is connected to the second node and a third node;
a third sensor unit which includes a third coil sensor configured to output a third sensor signal and disposed in a direction perpendicular to the first and second coil sensors, and is connected to the third node and a fourth node; and
a digital signal processor which is connected to the first and fourth nodes and is configured to output magnetic flux density based on a voltage difference between the first and fourth nodes,
wherein the first to third sensor units respectively output first to third output signals in which specific voltages of the first to third sensor signals are maintained for a predetermined period of time;
wherein the first to third coil sensors comprise:
a disc-shaped core configured to have a first diameter and a first height and correspond to the third coil sensor;
a first cylindrical core provided in the disc-shaped core to have a second diameter and a second height and correspond to the first coil sensor; and
a second cylindrical core provided in the disc-shaped core in a direction perpendicular to the first cylindrical core to have the second diameter and the second height and correspond to the second coil sensor,
wherein the second diameter is equal to or less than the first height, the second height is equal to or less than the first diameter, and central axes of the first and second cylindrical cores are parallel to a disc surface of the disc-shaped core.

2. The magnetic field measuring device of claim 1, wherein each of the first to third sensor units comprises a unidirectional element and an electrical storage element, the unidirectional element outputs a half-wave rectified signal by selecting only a positive portion of each of the first to third sensor voltages, and the electrical storage element outputs each of the first to third output signals by maintaining a maximum voltage of the half-wave rectified signal for the predetermined period of time.

3. The magnetic field measuring device of claim 1, wherein each of the first to third sensor units comprises a band-pass filter for selecting a signal corresponding to a specific frequency from the first to third sensor signals.

4. The magnetic field measuring device of claim 1, further comprising an amplifier which is connected to the first and fourth nodes and outputs an amplified signal by amplifying the voltage difference between the first and fourth nodes,
wherein the digital signal processor outputs the magnetic flux density based on the amplified signal.

5. The magnetic field measuring device of claim 1, wherein the digital signal processor comprises:
an analog-digital converter configured to convert the voltage difference between the first and fourth nodes into a digital code; and
a magnetic flux density conversion circuit configured to output the magnetic flux density corresponding to the digital code.

6. The magnetic field measuring device of claim 5, wherein the magnetic flux density conversion circuit converts the digital code into the magnetic flux density using a magnetic flux density conversion table.

7. The magnetic field measuring device of claim 6, wherein the magnetic flux density conversion table is stored in the magnetic flux density conversion circuit by measuring the voltage difference between the first and fourth nodes corresponding to a specific magnetic flux density.

8. The magnetic field measuring device of claim 5, wherein the magnetic flux density conversion circuit stores a relationship between the digital code and the magnetic flux density corresponding to a specific magnetic flux density in advance and converts the digital code into the magnetic flux density using the relationship.

9. A magnetic field measuring device comprising:
a first sensor unit which includes a first coil sensor configured to output a first sensor signal;
a second sensor unit which includes a second coil sensor configured to output a second sensor signal and disposed in a direction perpendicular to the first coil sensor;
a third sensor unit which includes a third coil sensor configured to output a third sensor signal and disposed in a direction perpendicular to the first and second coil sensors; and
a digital signal processor configured to convert magnetic flux density based on first to third output signals from the first to third sensor units,
wherein each of the first to third sensor units comprises a band-pass filter that is independent from the other sensor units to select the first to third output signals having a desired frequency which are respectively included in the first to third sensor signals,
wherein the first to third coil sensors comprise:
a disc-shaped core configured to have a first diameter and a first height and correspond to the third coil sensor;
a first cylindrical core provided in the disc-shaped core to have a second diameter and a second height and correspond to the first coil sensor; and
a second cylindrical core provided in the disc-shaped core in a direction perpendicular to the first cylindrical core to have the second diameter and the second height and correspond to the second coil sensor,
wherein the second diameter is equal to or less than the first height, the second height is equal to or less than the first diameter, and central axes of the first and second cylindrical cores are parallel to a disc surface of the disc-shaped core.

10. The magnetic field measuring device of claim 9, wherein each of the first to third sensor units comprises an amplifier that is independent from the other sensor units to amplify the first to third output signals.

11. The magnetic field measuring device of claim 9, wherein the digital signal processor comprises:
a first analog-digital converter configured to convert the first output signal into a first voltage code;
a second analog-digital converter configured to convert the second output signal into a second voltage code; and
a third analog-digital converter configured to convert the third output signal into a third voltage code.

12. The magnetic field measuring device of claim 11, wherein the digital signal processor comprises a magnetic flux density conversion circuit configured to respectively convert first to third sub-magnetic flux densities corresponding to the first to third voltage codes and sum the first to third sub-magnetic flux densities to calculate the magnetic flux density.

13. The magnetic field measuring device of claim 12, wherein the magnetic flux density conversion circuit converts the first to third voltage codes into the first to third sub-magnetic flux densities using a magnetic flux density conversion table.

14. The magnetic field measuring device of claim 11, wherein the digital signal processor comprises a magnetic flux density conversion circuit configured to calculate a total voltage code by summing the first to third voltage codes and convert the total voltage code into the magnetic flux density.

15. A triaxial coil sensor comprising:
a first coil sensor configured to include a disc-shaped core having a first diameter and a first height and a first coil wound around the disc-shaped core;
a second coil sensor configured to include a first cylindrical core provided in the disc-shaped core to have a second diameter and a second height and a second coil wound on a cylindrical surface of the first cylindrical core; and
a third coil sensor configured to include a second cylindrical core provided in the disc-shaped core in a direction perpendicular to the first cylindrical core to have the second diameter and the second height and a third coil wound on a cylindrical surface of the second cylindrical core,
wherein central axes of the first and second cylindrical cores are parallel to a disc surface of the disc-shaped core.

16. The triaxial coil sensor of claim 15, wherein the second diameter is equal to or less than the first height, and the second height is equal to or less than the first diameter.

* * * * *